United States Patent [19]

Oomura

[11] Patent Number: 5,796,524

[45] Date of Patent: Aug. 18, 1998

[54] CATADIOPTRIC OPTICAL SYSTEM AND EXPOSURE APPARATUS USING THE SAME

[75] Inventor: Yasuhiro Oomura, Oota-ku, Japan

[73] Assignee: Nikon Corporation, Japan

[21] Appl. No.: 566,419

[22] Filed: Nov. 30, 1995

[30] Foreign Application Priority Data

Dec. 27, 1994 [JP] Japan ................... 6-324433

[51] Int. Cl.[6] ........................................ G02B 27/14
[52] U.S. Cl. ...................... 359/633; 359/731; 359/732
[58] Field of Search .......................... 359/727, 732, 359/630, 633, 730, 731

[56] References Cited

U.S. PATENT DOCUMENTS

| | | | |
|---|---|---|---|
| 3,917,399 | 11/1975 | Buzawa et al. | 356/114 |
| 4,790,637 | 12/1988 | Mercado et al. | 359/730 |
| 4,953,960 | 9/1990 | Williamson . | |
| 5,089,913 | 2/1992 | Singh et al. | 359/727 |
| 5,241,423 | 8/1993 | Chiu et al. | 359/727 |
| 5,530,586 | 6/1996 | Yasugaki | 359/630 |

FOREIGN PATENT DOCUMENTS

| | | |
|---|---|---|
| 2-66510 | 3/1990 | Japan . |
| 4-277612 | 10/1992 | Japan . |
| 5-72478 | 3/1993 | Japan . |

Primary Examiner—David C. Nelms
Assistant Examiner—Thomas Robbins
Attorney, Agent, or Firm—Pennie & Edmonds LLP

[57] ABSTRACT

This invention provides a catadioptric optical system for achieving excellent imaging performance to obtain a resolution of quartermicron order. The catadioptric optical system is an optical system for transferring a reduced image of a pattern on a first plane onto a second plane and includes a beam splitter, an input lens group for guiding a light beam having a predetermined wavelength from the first plane to the beam splitter, an output lens group for guiding the light beam from the beam splitter to the second plane, a first concave mirror having an enlargement magnification, and a second concave mirror having a reduction magnification. The first concave mirror is arranged in an optical path of the light beam incident from the input lens group on the beam splitter and passing through the beam splitter to cause the passing light beam to be incident on the beam splitter again. The second concave mirror is arranged in an optical path of the light beam incident from the first concave mirror on the beam splitter and reflected by a beam splitter plane in the beam splitter and causes the reflected light beam to be incident on the beam splitter again.

15 Claims, 8 Drawing Sheets

5,796,524

CATADIOPTRIC OPTICAL SYSTEM AND EXPOSURE APPARATUS USING THE SAME

BACKGROUND OF THE INVENTION

1. Field of the Invention

The present invention relates to a catadioptric reduction optical system suitable for a projection optical system for reduction projection in a projection exposure apparatus used to manufacture semiconductor elements or liquid crystal display elements by photolithography and, more particularly, to a catadioptric reduction optical system using a reflection system as an element of an optical system to realize a resolution of quartermicron order in the ultraviolet wavelength region.

2. Related Background Art

In photolithography for manufacturing semiconductor elements or the like, a projection exposure apparatus which reduces a pattern image of a photomask or reticle (both will be referred to as a "reticle" hereinafter) to about ¼ to ⅕ through a projection optical system and exposures the pattern image onto a substrate (e.g., a wafer or a glass plate) coated with a photoresist or the like is used. As the degree of integration of a semiconductor element or the like is improved, a resolution required to a projection optical system used in a projection exposure apparatus increases. To cope with this requirement, the wavelength of illumination light is required to be shortened, and the numerical aperture (N.A.) of the projection optical system is required to be increased.

However, when the wavelength of illumination light is shortened, only a limited number of types of glass materials can be practically used because of light absorption. At a wavelength of 300 nm or less, only synthetic silica and fluorite are available as glass materials suitable for practical use. When the projection optical system is constituted by only a refraction system, correction of various aberrations including a chromatic aberration becomes difficult.

To the contrary, a reflection system has no chromatic aberration. Therefore, a technique of forming a reduction projection optical system by a catadioptric optical system consisting of a reflection system and a refraction system is proposed in, e.g., U.S. Pat. Nos. 4,953,960, 5,089,913, and 5,402,267.

Each of these catadioptric optical systems has an input lens group for guiding a light beam from an object to a beam splitter for changing an optical path, a single concave mirror for reflecting the light beam from the input lens group through the beam splitter and returning the light beam to the beam splitter, and an output lens group for guiding the light beam from the single concave mirror through the beam splitter onto a predetermined image plane. In all of the catadioptric optical systems disclosed in the above prior arts, the concave mirror is constituted by a single converging mirror having a reduction imaging magnification.

SUMMARY OF THE INVENTION

In the conventional catadioptric optical systems, assume that, to improve the efficiency of the reflection optical system, i.e., to satisfactorily correct aberrations including a chromatic aberration, the positive refracting power of the concave mirror is increased. In this case, the incident light beam from the input lens group toward the concave mirror through the beam splitter and the exit light beam from the concave mirror toward the output lens group through the beam splitter have large angles with respect to the optical axis when these light beams pass through the beam splitter.

The direction change surface (beam splitter surface) in the beam splitter has angular characteristics. For this reason, when the incident and exit light beams pass through or are reflected by the direction change surface in the beam splitter, a wavefront aberration occurs on this direction change surface. The wavefront aberration results in a degradation in imaging performance of the catadioptric optical system itself. In addition, since the reflectivity/transmittance on the direction change surface partially changes because of the angular characteristics of the reflectivity/transmittance on the direction change surface, the resolution of the catadioptric optical system itself is degraded.

In the conventional catadioptric optical systems, assume that, to improve the imaging performance and resolution of the catadioptric optical system, the angles of the incident and exit light beams with respect to the optical axis on the direction change surface in the beam splitter are decreased. In this case, the positive refracting power of the concave mirror consisting of a converging mirror cannot be increased. This makes it difficult to satisfactorily correct aberrations including a chromatic aberration.

It is an object of the present invention to provide a catadioptric optical system which achieves an excellent imaging performance to realize a resolution of quartermicron order in the ultraviolet wavelength region.

A catadioptric optical system according to the present invention can be applied to both a one-shot exposure apparatus and a scanning exposure apparatus. An exposure apparatus to which this catadioptric optical system is applied comprises at least a first stage (wafer stage) allowing a photosensitive substrate (e.g., a silicon wafer or glass plate having a surface coated with a photoresist) to be held on a main surface thereof, a second stage (reticle stage) for holding a mask (e.g., a reticle) having a predetermined pattern, and an illumination optical system for irradiating an exposure light having a predetermined wavelength onto the mask and transferring the pattern of the mask onto the substrate. The catadioptric optical system according to the present invention is applied as an optical system arranged between an object plane (first plane) on the mask and an image plane (second plane) on the substrate to project a reduced image of the pattern of the mask on the first plane onto the second plane on the substrate.

The catadioptric optical system according to the present invention comprises a beam splitter, an input lens group, arranged in an optical path between the first plane and the beam splitter, for guiding the light beam from the first plane to the beam splitter, an output lens group, arranged in an optical path between the beam splitter and the second plane, for guiding the light beam from the beam splitter to the second plane, and two concave mirrors. One of the concave mirrors is a first concave mirror having an enlargement imaging magnification. The first concave mirror causes the light beam incident from the input lens group onto the beam splitter and passing through the beam splitter to be incident onto the beam splitter again. The other concave mirror is a second concave mirror having a reduction imaging magnification. The second concave mirror causes the light beam incident from the first concave mirror onto the beam splitter and passing through the beam splitter to be incident onto the beam splitter again.

In particular, the first concave mirror is arranged in the optical path of the light beam incident from the input lens group onto the beam splitter and passing through the beam splitter. The second concave mirror is arranged in the optical path of the light beam incident from the first concave mirror onto the beam splitter and reflected by the direction change surface (beam splitter plane) in the beam splitter. In other words, the first concave mirror is arranged on an opposite side of the input lens group with respect to the beam splitter. The second concave mirror is arranged on an opposite side of the output lens group with respect to the beam splitter.

According to the present invention with the above arrangement, the light beam between the first concave mirror having an enlargement magnification and the second concave mirror having a reduction magnification has no large angle with respect to the optical axis. For this reason, the influence of the angular characteristics on the direction change surface in the beam splitter is minimized. In addition, since the two concave mirrors share a positive refracting power, the total positive refracting power can be increased without largely increasing the positive refracting power of each concave mirror. Therefore, according to the present invention, since the reflection system can impart a large positive refracting power, aberrations including a chromatic aberration can be satisfactorily corrected. In addition, since the influence of the angular characteristics on the direction change surface in the beam splitter can be minimized, an excellent imaging performance can be obtained.

According to the preferred embodiments of the present invention, the first concave mirror is preferably arranged in the optical path of the light beam incident from the input lens group onto the beam splitter and transmitted through the beam splitter. The second concave mirror is preferably arranged in the optical path of the light beam incident from the first concave mirror onto the beam splitter and reflected by the direction change surface in the beam splitter.

Generally, the influence of the angular characteristics of the direction change surface in the beam splitter on the light beam reflected by the direction change surface is larger than on the light beam transmitted through the direction change surface.

In the preferred embodiments of the present invention, the light beam from an object (first plane) passes through the beam splitter at a predetermined divergence angle and reaches the first concave mirror having an enlargement magnification. This light beam is reflected by the first concave mirror while receiving a further divergent action, incident on the beam splitter again, and reflected by the direction change surface in the beam splitter. At this time, the light beam incident from the first concave mirror on the direction change surface has a smaller angle with respect to the optical axis than that of the light beam incident from the object plane and transmitted through the direction change surface. In the present invention, the angle of the light beam reflected on the direction change surface, which light beam is largely influenced by the angular characteristics, is decreased. Therefore, a degradation in imaging performance and resolution of the catadioptric optical system itself can be minimized.

In the preferred embodiments of the present invention, the light beam reflected by the direction change surface in the beam splitter is reflected by the second concave mirror having a reduction magnification and returned to the beam splitter again. At this time, the light beam from the second concave mirror is converged and reaches a predetermined image plane. This light beam is transmitted through the direction change surface, so the influence of the angular characteristics on the direction change surface is not so large.

In the preferred embodiments of the present invention, the positive refracting power shared by the first and second concave mirrors is determined by the incident angle of the light beam incident from the object to the first concave mirror and the exit angle of the light beam exiting from the second concave mirror, the exit light beam being reached from the first concave mirror to the second concave mirror. In the preferred embodiments of the present invention, the angle of the light beam with respect to the optical axis, which light beam moves from the first concave mirror to the second concave mirror, is decreased although the positive refracting power is shared by the first and second concave mirrors. Therefore, the influence of the angular characteristics on the direction change surface is minimized.

According to the preferred embodiments of the present invention, the imaging performance and resolution of the catadioptric optical system itself can be largely improved while utilizing an advantage of the catadioptric optical system such that the positive refracting power is shared by concave mirrors.

In the catadioptric optical system according to the present invention, the following conditions (1) and (2) are preferably satisfied:

$$-0.9 < 1/\beta_{M1} < 0.8 \quad (1)$$

$$-0.07 < \beta_{M2} < 0.06 \quad (2)$$

where $\beta_{M1}$: the imaging magnification of the first concave mirror, $\beta_{M2}$: the imaging magnification of the second concave mirror.

Conditions (1) and (2) define the preferable ranges of the imaging magnifications of the first and second concave mirrors, respectively.

When the ratio is set below the lower limit of condition (1), the imaging magnification of the first concave mirror is close to x1, and the angle of the light beam from the first concave mirror to the second concave mirror through the beam splitter becomes too large with respect to the optical axis. At this time, the influence of the angular characteristics on the direction change surface in the beam splitter undesirably becomes too large. In addition, the converged light beam is incident on the second concave mirror having a reduction magnification to make it difficult to sufficiently ensure the working distance on the image side. Note that the lower limit of condition (1) is preferably set to −0.5, i.e., $-0.5 < 1/\beta_{M1}$.

When the ratio is set above the upper limit of condition (1), the enlargement magnification of the first concave mirror becomes too large, and the degree of divergence of the light beam from the first concave mirror toward the second concave mirror through the beam splitter is increased. At this time, the influence of the angular characteristics on the direction change surface in the beam splitter undesirably becomes too large. In addition, the size of the beam splitter is undesirably increased. Furthermore, the positive refracting power imparted by the reflection system is undesirably decreased. Note that the upper limit of condition (1) is preferably set to 0.4, i.e., $1/\beta_{M1} < 0.4$.

When the magnification is set below the lower limit of condition (2), the positive refracting power of the second concave mirror becomes too large. Therefore, the light beam to be incident onto the second concave mirror must be diverged. At this time, the influence of the angular characteristics on the direction change surface in the beam splitter undesirably becomes too large. Note that the lower limit of condition (2) is set to −0.05, i.e., $-0.05 < \beta_{M2}$.

When the magnification is set above the upper limit of condition (2), the positive refracting power of the second concave mirror becomes small. This undesirably decreases the positive refracting power imparted by the reflection system. At this time, since a converged light beam must be incident on the second concave mirror, the influence of the angular characteristics on the direction change surface in the beam splitter becomes large. At this time, when the numerical aperture on the image side is increased, the light beam incident from the first concave mirror on the second concave mirror through the beam splitter must be a converged light beam with a very large diameter on the first concave mirror side. This undesirably increases the size of the beam splitter. Note that the upper limit of condition (2) is set to 0.05, i.e., $\beta_{M2}<0.05$.

In the present invention, an additional lens group is preferably arranged in the optical path between the beam splitter and the first concave mirror. This additional lens group has a function of correcting a spherical aberration mainly occurring from one or both of the first and second concave mirrors. As for the arrangement of the additional lens group, it can also be arranged between the beam splitter and the second concave mirror. In the present invention, however, the second concave mirror has a reduction magnification, which undesirably increases the size of the beam splitter.

In the present invention, the input lens group, the additional lens group, and the first concave mirror are preferably arranged to satisfy the following condition (3):

$$-0.27<1/\beta_1<0.25 \quad (3)$$

where $\beta_1$: the synthetic imaging magnification by the input lens group, the additional lens group, and the first concave mirror.

When the ratio is set below the lower limit of condition (3), the angle of the light beam from the first concave mirror to the second concave mirror through the beam splitter becomes too large with respect to the optical axis. This undesirably increases the influence of the angular characteristics on the direction change surface in the beam splitter. In addition, since the converged light beam is incident on the second concave mirror having a reduction magnification, it undesirably becomes difficult to sufficiently ensure the working distance on the image side.

When the ratio is set above the upper limit of condition (3), the degree of divergence of the light beam from the first concave mirror toward the second concave mirror through the beam splitter becomes large. This undesirably increases the influence of the angular characteristics on the direction change surface in the beam splitter. In addition, since the beam splitter must pass a divergent light beam with a large angle from the first concave mirror, the size of the beam splitter itself undesirably becomes large.

In the present invention, the second concave mirror and the output lens group are preferably arranged to satisfy the following condition (4):

$$-0.05<\beta_2<0.07 \quad (4)$$

where $\beta_2$: the synthetic imaging magnification of the second concave mirror and the output lens group.

When the magnification is set below the lower limit of condition (4), the light beam to be incident on the second concave mirror must be a divergent light beam. This undesirably increases the influence of the angular characteristics on the direction change surface in the beam splitter.

When the magnification is set above the upper limit of condition (4), a converged light beam must be incident on the second concave mirror. This increases the influence of the angular characteristics on the direction change surface in the beam splitter. At this time, when the numerical aperture on the image side is increased, the diameter of the light beam incident from the first concave mirror on the second concave mirror through the beam splitter is increased, resulting in an increase in size of the beam splitter. At this time, it becomes difficult to correct aberrations occurring in the beam splitter. In addition, it is also difficult to manufacture the beam splitter to result in an increase in manufacturing cost.

To obtain an achromatic optical system of the present invention, which satisfies a resolution in units of $\frac{1}{4}$ microns at a wavelength of 300 nm or less, at least one of lens components which has a negative refracting power in the input lens group is preferably formed of fluorite, and at least one of lens components which has a positive refracting power in the output lens group is preferably formed of fluorite. When the lens component having the negative refracting power in the input lens group is formed of fluorite, the chromatic aberration of magnification can be corrected by this lens component. When the lens component having the positive refracting power in the output lens group is formed of fluorite, the on-axis chromatic aberration can be corrected.

In the present invention, to decrease a loss in light amount in the beam splitter and prevent harmful flare light, the beam splitter is preferably constituted by a polarization beam splitter. Additionally, $\lambda/4$ plates are preferably arranged in the optical path between the polarization beam splitter and the first concave mirror and in the optical path between the polarization beam splitter and the second concave mirror.

In the present invention, the additional lens group arranged between the beam splitter and the first concave mirror can be replaced with an arrangement in which one or both of the first and second concave mirrors are constituted by aspheric mirrors, or a refraction element is added to the input lens group.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Embodiments of a catadioptric optical system according to the present invention will be described below with reference to FIGS. 1 to 9. This catadioptric optical system can be applied to both a one-shot exposure apparatus and a scanning exposure apparatus.

Figure 1:
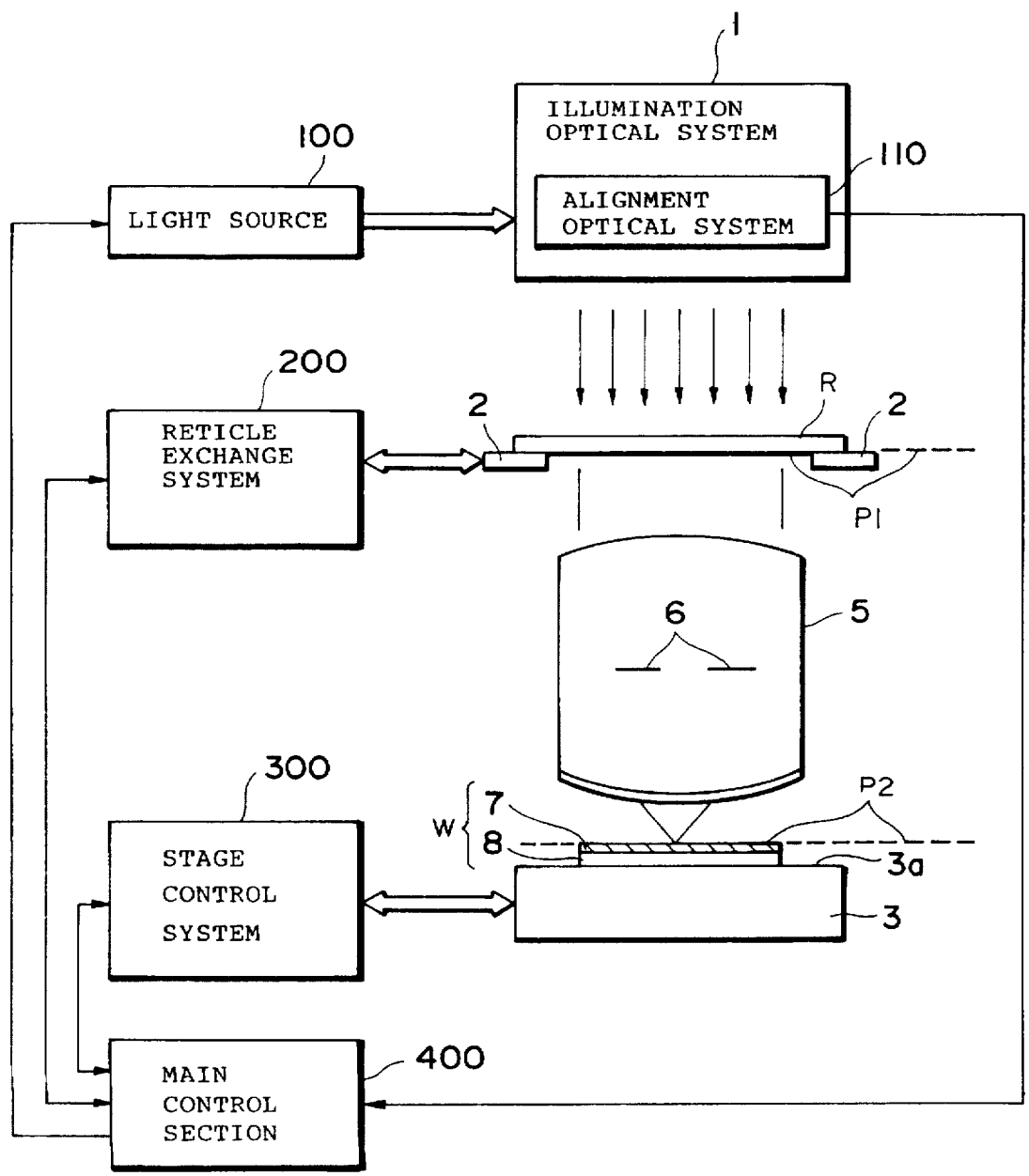
FIG. 1 is a view showing the arrangement of a one-shot exposure apparatus to which a catadioptric optical system according to the present invention can be applied.

FIG. 1 is a view showing the arrangement of an apparatus using a one-shot exposure method. Referring to FIG. 1, the exposure apparatus comprises a movable wafer stage 3 (first stage) capable of holding a photosensitive substrate W on a main surface 3a, a movable reticle stage 2 (second stage) for holding a reticle R, a light source 100 for irradiating an exposure light beam having a predetermined wavelength, and an illumination optical system 1 for irradiating the exposure light from the light source 100 onto the reticle R and transferring a predetermined pattern of an electronic circuit or the like on the reticle onto the substrate W. The photosensitive substrate W is formed of an underlaying substrate 8 (exposure target) such as a silicon wafer or a glass plate having a surface coated with a photosensitive material 7 such as a photoresist. The illumination optical system 1 has an alignment optical system 110 for aligning the reticle R and the photosensitive substrate W.

The exposure apparatus also has a reticle exchange system 200 for exchanging the reticle R held on the reticle stage 2 or moving the reticle stage 2 in accordance with an instruction from a main control section 400, and a stage control system 300 for moving the wafer stage 3 in accordance with an instruction from the main control section. When alignment of the reticle R and the photosensitive substrate W is to be performed, the main control section 400 obtains the displacement amounts of the stages 2 and 3 from the alignment optical system 110, calculates the moving amounts of the stages 2 and 3, and outputs moving instructions to the stages 2 and 3. The stages 2 and 3 are moved in predetermined directions in accordance with the moving instructions and moving amounts from the main control section 400, thereby adjusting the relative position between the reticle R and the photosensitive substrate W.

A catadioptric optical system 5 according to the present invention is arranged between the reticle stage 2 and the wafer stage 3, i.e., between a first plane P1 (object plane) on the reticle R and a second plane P2 (image plane) on the photosensitive substrate W, to project a reduced image of a predetermined pattern on the reticle R onto the substrate W.

Figure 2:
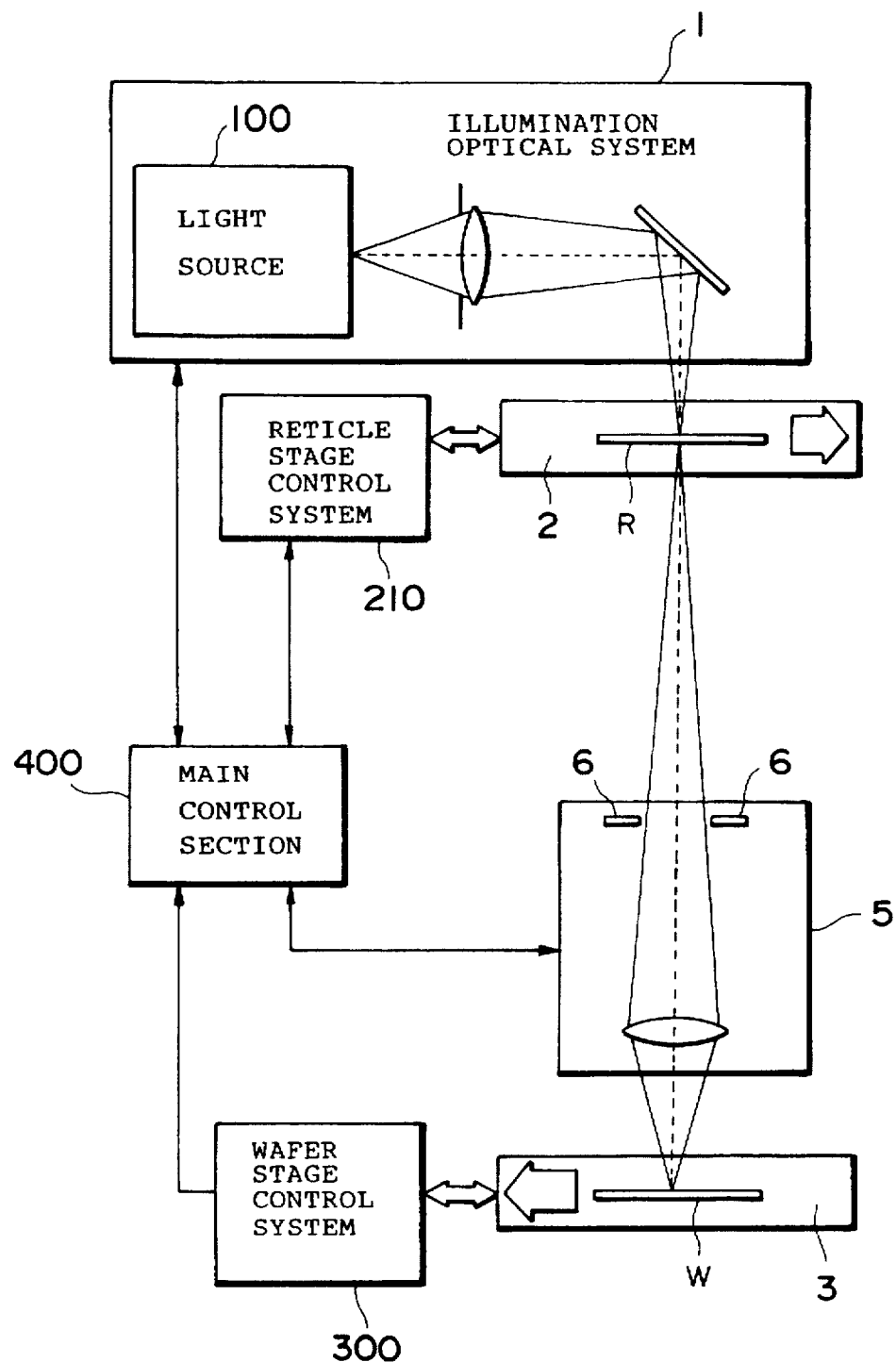
FIG. 2 is a view showing the arrangement of a scanning exposure apparatus to which the catadioptric optical system according to the present invention can be applied.

FIG. 2 is a view showing the arrangement of an apparatus using a scanning exposure method to which the catadioptric optical system according to the present invention can be applied. As in the one-shot exposure apparatus shown in FIG. 1, this exposure apparatus comprises the movable reticle stage 2, the movable wafer stage 3, the illumination optical system 1 (including the light source 100), and the catadioptric optical system 5 according to the present invention. The illumination optical system 1 irradiates an exposure light from the light source 100 onto an exposure area Rf having a predetermined shape on the reticle R (see FIG. 3). The catadioptric optical system 5 projects a reduced image of a pattern on the illumination area Rf of the reticle R onto the substrate W (photosensitive substrate). A reticle stage control system 210 can move the reticle stage 2 in a predetermined direction while holding the reticle R to change the relative position of the reticle R with respect to the substrate W. The reticle stage control system 210 is included in the reticle exchange system 200. Similarly, the wafer stage control system 300 moves the wafer stage 3 in a predetermined direction while holding the substrate W to change the relative position of the substrate W with respect to the reticle R. A computer system serving as the main control section 400 independently controls the reticle stage control system 210 and the wafer stage control system 300. With this arrangement, the exposure apparatus can perform scanning exposure in which the relative position between an exposure area Wf on the substrate W and the irradiation area Rf on the reticle R is changed.

Techniques associated with the above exposure apparatus are disclosed in, e.g., U.S. Ser. Nos. 08/255,927, 08/260,398, and 08/299,305, and U.S. Pat. Nos. 4,497,015, 4,666,273, 5,194,893, 5,253,110, 5,333,035, and 5,379,091. The catadioptric optical system according to the present invention can be applied to all exposure apparatuses disclosed in these prior arts.

U.S. Ser. No. 08/255,927 describes an illumination optical system (using a laser source) applicable to a scanning exposure apparatus. U.S. Ser. No. 08/260,398 describes an illumination optical system (using a lamp source) applicable to a scanning exposure apparatus. U.S. Ser. No. 08/299,305 describes an alignment optical system applicable to a scanning exposure apparatus. U.S. Pat. No. 4,497,015 describes an illumination optical system (using a lamp source) applicable to a general exposure apparatus. U.S. Pat. No. 4,666,273 describes a step-and-repeat exposure apparatus. U.S. Pat. No. 5,194,893 describes a scanning exposure apparatus and, more particularly, an illumination optical system, an illumination area, a mask-side/reticle-side interference system, an automatic focusing mechanism, and an alignment optical system. U.S. Pat. No. 5,253,110 describes an illumination optical system (using a laser source) applied to a step-and-repeat exposure apparatus. The illumination optical system disclosed in this reference can also be applied to a scanning exposure apparatus. U.S. Pat. No. 5,333,035 describes a modified illumination optical system applied to a general exposure apparatus. U.S. Pat. No. 5,379,091 describes an illumination optical system (using a laser source) applied to a scanning exposure apparatus.

An embodiment of the catadioptric optical system according to the present invention will be described below in detail. The catadioptric optical system of this embodiment can be applied to the exposure apparatuses shown in FIGS. 1 and 2. Note that an X-Y-Z coordinate system is used in FIG. 3.

Figure 3:
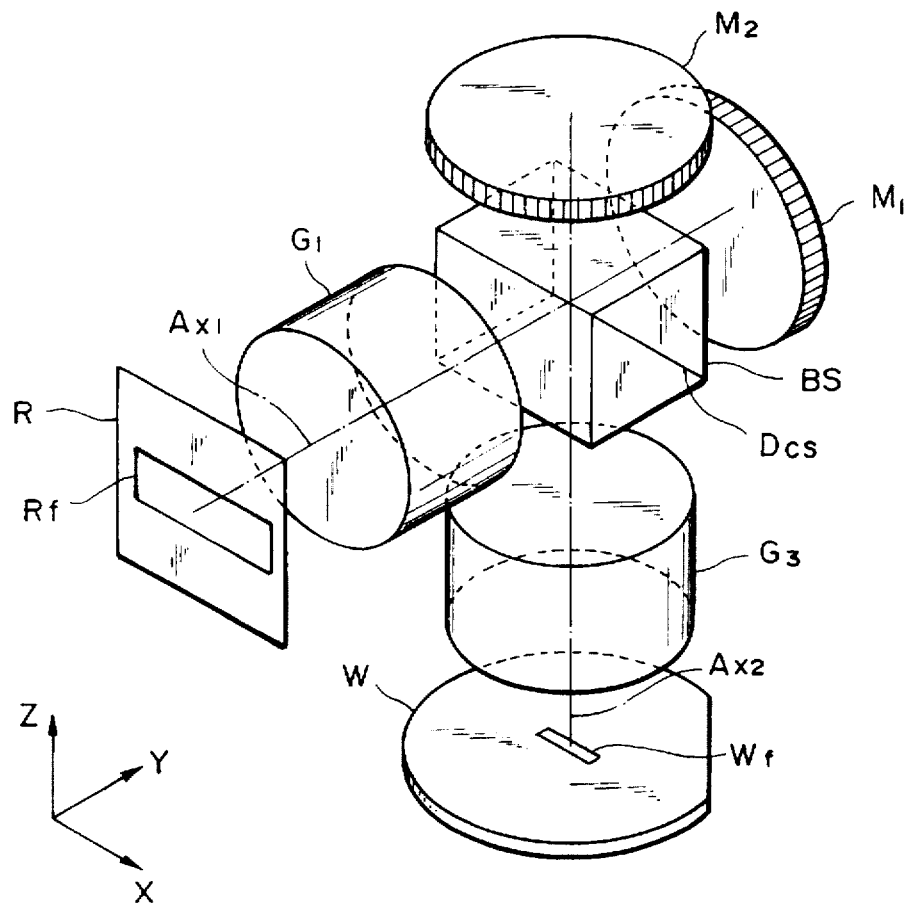
FIG. 3 is a perspective view schematically showing the arrangement of the catadioptric optical system according to the present invention.

The catadioptric optical system shown in FIG. 3 has a first lens group $G_1$ serving as an input lens group for guiding a light beam from the reticle R as an object to a beam splitter BS, a first concave mirror $M_1$ arranged on an opposite side of the first lens group $G_1$ with respect to the beam splitter BS, a second concave mirror $M_2$ arranged in the optical path of the light beam from the first concave mirror $M_1$, which light beam is reflected by a direction change surface $D_{cs}$ (beam splitting surface) in the beam splitter BS, and a third lens group $G_3$ serving as an output lens group arranged on an opposite side of the second concave mirror $M_2$ with respect to the beam splitter BS. The first lens group $G_1$ and the first concave mirror $M_1$ are arranged along an optical axis $Ax_1$. The second concave mirror $M_2$ and the third lens group $G_3$ are arranged along an optical axis $Ax_2$. The optical axes $Ax_1$ and $Ax_2$ are perpendicular to each other at the position of the direction change surface $D_{cs}$. That is, the direction change surface $D_{cs}$ has a function of deflecting the optical axis.

The reticle R is held on the reticle stage 2 to be movable in the Z direction. The wafer W arranged on the image plane is mounted on the wafer stage 3 to be movable in the Y direction. Note that the illumination optical system 1 for uniformly illuminating the area Rf of the reticle R is arranged on the −Y (minus Y) direction side of the reticle R.

A light beam from the area Rf of the reticle R sequentially passes through the first lens group $G_1$ and the beam splitter BS. Thereafter, the light beam is reflected by the first concave mirror $M_1$ and incident on the beam splitter BS again. This light beam is reflected by the direction change surface $D_{cs}$ in the beam splitter BS and then reflected by the second concave mirror $M_2$. The light beam reaches the beam splitter BS again, passes through the beam splitter BS and the third lens group $G_3$, and reaches the exposure area Wf on the wafer W. A reduced image of the area Rf of the reticle R is formed on the area wf (see FIG. 4).

In the optical system shown in FIG. 3, uniform illumination is performed by the illumination optical system while moving the reticle R in the +Z (plus Z) direction and moving the wafer W in the +Y (plus Y) direction. With this operation, the image of the reticle R is sequentially formed on the wafer W. Note that the moving amounts of the reticle R and the wafer W correspond to the reduction magnification of the catadioptric optical system.

The first and second embodiments as numerical embodiments of the catadioptric optical system according to the present invention will be described below. In the following embodiments, the catadioptric optical system 5 uses an ArF excimer laser for supplying a light beam having an exposure wavelength of 193.4 nm as the light source 100 of the illumination optical system 1 shown in FIG. 1 or 2.

Figure 5:
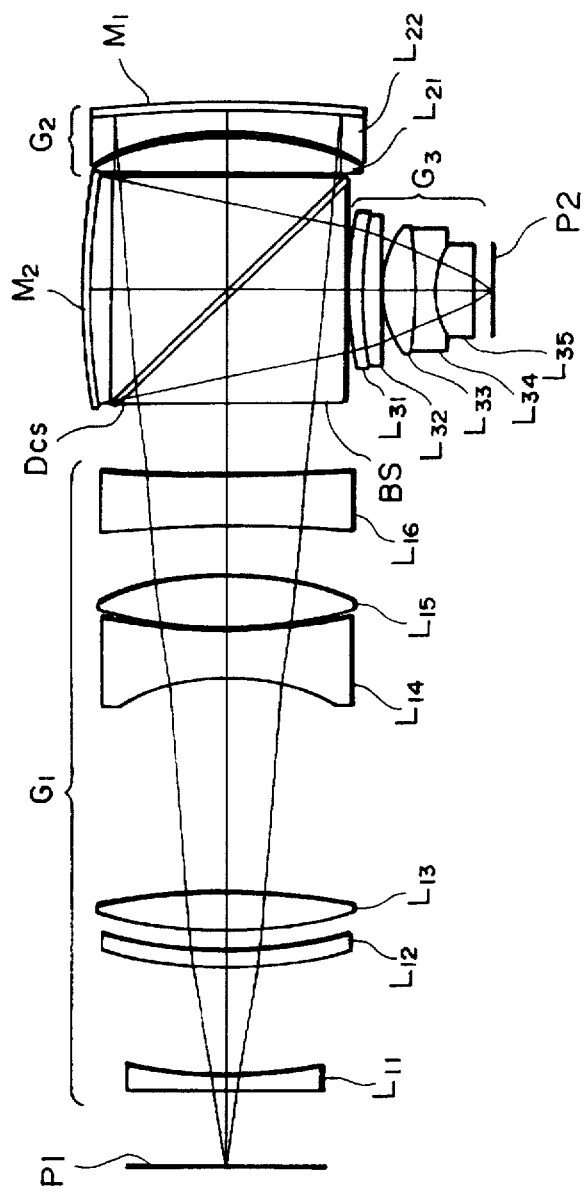
FIG. 5 is a view showing the arrangement of the first embodiment of the catadioptric optical system according to the present invention.
Figure 6:
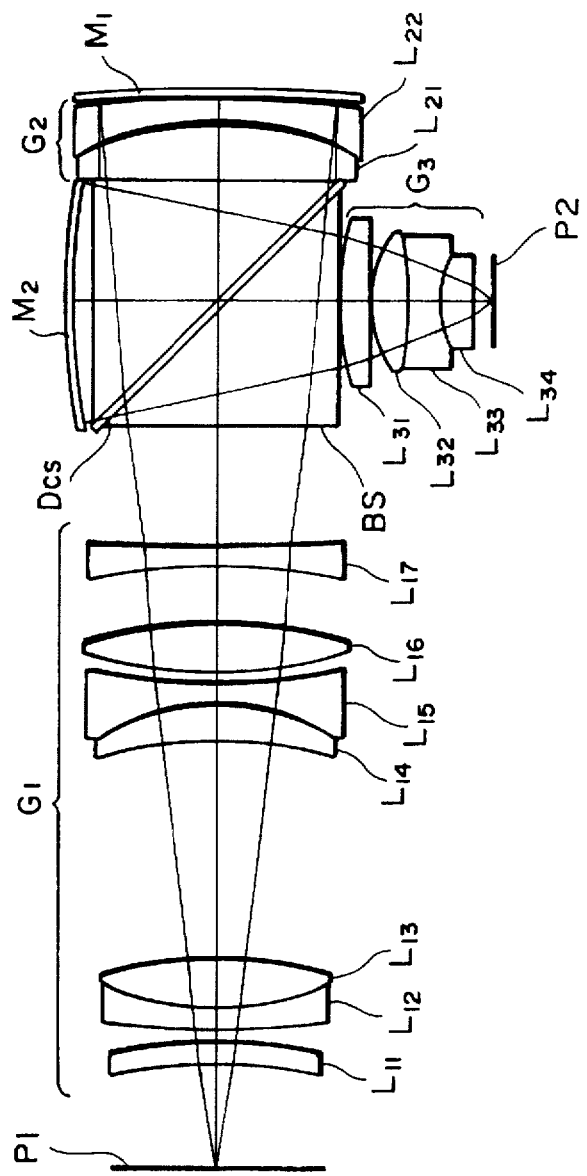
FIG. 6 is a view showing the arrangement of the second embodiment of the catadioptric optical system according to the present invention.

FIGS. 5 and 6 are views showing the optical paths of the catadioptric optical systems according to the first and second embodiments of the present invention, respectively. As shown in FIGS. 5 and 6, the catadioptric optical system of each embodiment has the first lens group $G_1$ serving as an input lens group, the beam splitter BS having the direction change surface $D_{cs}$, a second lens group $G_2$ serving as an additional lens group, the first concave mirror $M_1$ having an enlargement imaging magnification, the second concave mirror $M_2$ having a reduction imaging magnification, and the third lens group $G_3$ serving as an output lens group.

Figure 4:
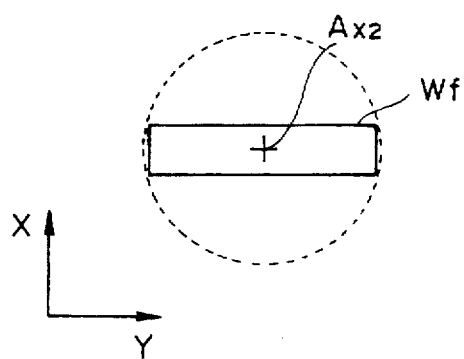
FIG. 4 is a plan view showing an exposure area on a substrate in the catadioptric optical system shown in FIG. 3.

In the catadioptric optical systems of the embodiments shown in FIGS. 5 and 6, the magnification of the overall system is ×¼, the numerical aperture (N.A.) on the wafer W side (image side) is 0.6, and the working distance on the wafer W side is 15.0 mm. As shown in FIG. 4 which is a plan view showing the exposure area on the wafer W of the catadioptric optical system, the catadioptric optical systems of the embodiments shown in FIGS. 5 and 6 have a slit-like exposure area having a size of 30 mm×6 mm in a range (range indicated by a dashed line in FIG. 4) up to a 15.3-mm image height from the optical axis $Ax_2$ on the wafer W. Note that the beam splitter BS of the catadioptric optical system of each embodiment, which is shown in FIG. 2 or 3, has a size of 180 mm×180 mm×200 mm.

The lens arrangement of the first embodiment will be described below in detail. As shown in FIG. 5, the first lens group $G_1$ comprises a negative meniscus lens $L_{11}$ with its convex surface facing the object side, a positive meniscus lens $L_{12}$ with its convex surface facing the first plane P1 side, a biconvex positive lens $L_{13}$, a biconcave negative lens $L_{14}$, a biconvex positive lens $L_{15}$, and a biconcave negative lens $L_{16}$ in an order from the first plane P1 side (object side). The second lens group $G_2$ comprises a biconvex positive lens $L_{21}$ with its strong convex surface facing the first concave mirror $M_1$ side, and a negative meniscus lens $L_{22}$ with its concave surface facing the beam splitter BS side in an order from the beam splitter BS side. The third lens group $G_3$ comprises a positive meniscus lens $L_{31}$ with its convex surface facing the beam splitter BS side, a positive meniscus lens $L_{32}$ with its convex surface facing the beam splitter BS side, a biconvex positive lens $L_{33}$ with its strong convex surface facing the beam splitter BS side, a biconcave negative lens $L_{34}$ with its strong concave surface facing the second plane P2 side (image side), and a biconvex positive lens $L_{35}$ with its strong convex surface facing the beam splitter BS side in an order from the beam splitter BS side.

The lens arrangement of the catadioptric optical system of the second embodiment shown in FIG. 6 will be described below in detail. The first lens group $G_1$ comprises a negative meniscus lens $L_{11}$ with its concave surface facing the reticle R side, a negative meniscus lens $L_{12}$ with its convex surface facing the first plane P1 side, a biconvex positive lens $L_{13}$, a positive meniscus lens $L_{14}$ with its concave surface facing the first plane P1 side, a negative biconcave lens $L_{15}$ with its strong concave surface facing the first plane P1 side, a biconvex positive lens $L_{16}$, and a biconcave negative lens $L_{17}$ with its strong concave surface facing the first plane P1 side in an order from the first plane P1 side (object side). The second lens group $G_2$ comprises a biconvex positive lens $L_{21}$ with its strong convex surface facing the first concave mirror $M_1$ side, and a negative meniscus lens $L_{22}$ with its concave surface facing the beam splitter BS side in an order from the beam splitter BS side. The third lens group $G_3$ comprises a positive meniscus lens $L_{31}$ with its convex surface facing the beam splitter BS side, a biconvex positive lens $L_{32}$ with its convex surface facing the beam splitter BS side, a biconcave negative lens $L_{33}$ with its strong concave surface facing the second plane P2 side, and a biconvex positive lens $L_{34}$ with its strong convex surface facing the beam splitter BS side in an order from the beam splitter BS side.

Figure 9:
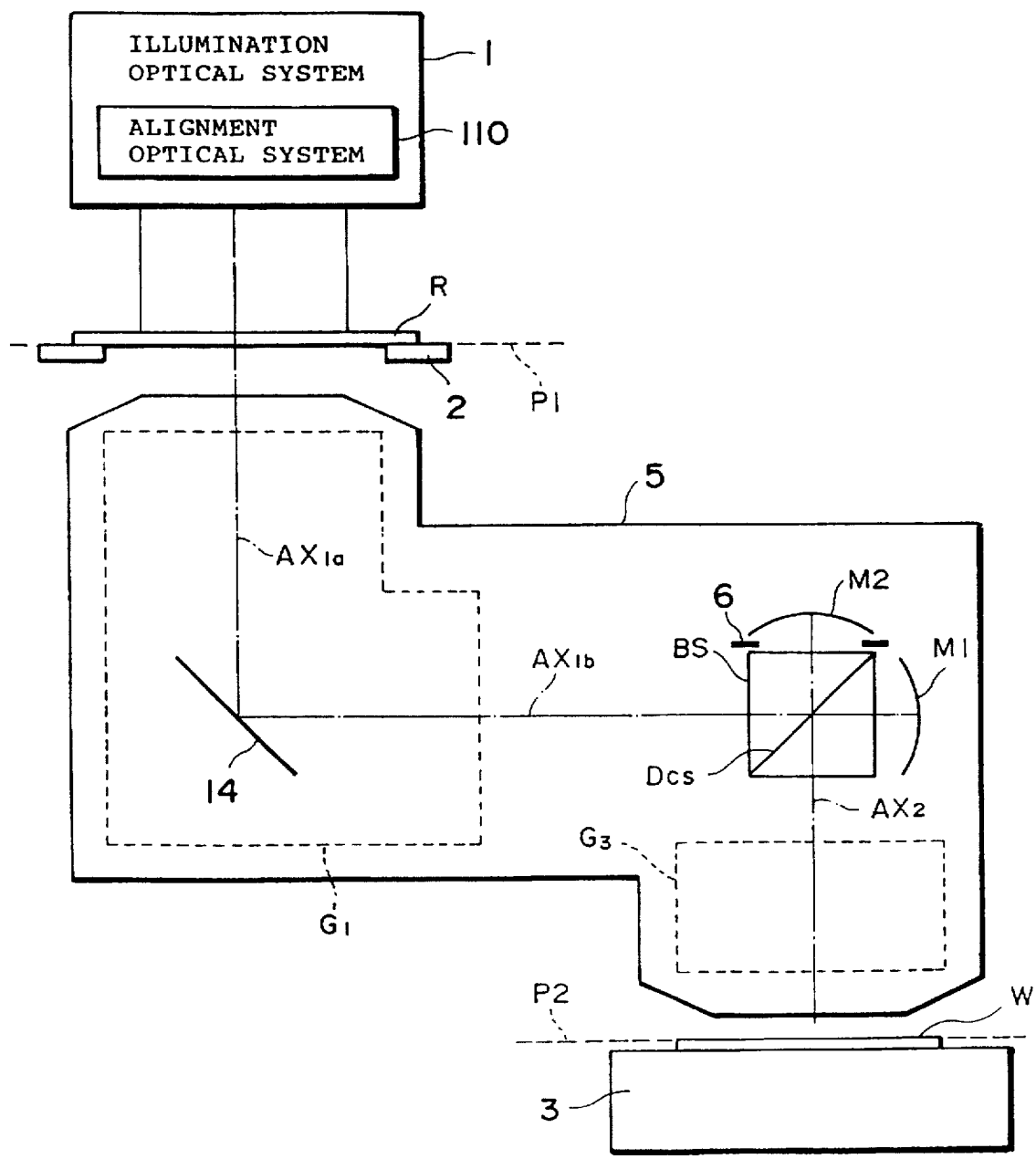
FIG. 9 is a view showing the arrangement of an application of the catadioptric optical system according to the present invention, in which the first plane and the second plane are arranged in parallel.

In each of the catadioptric optical systems of the first and second embodiments, an aperture stop 6 is arranged in the optical path between the beam splitter BS and the second concave mirror $M_2$ (FIGS. 1, 2, and 9).

The specification values of each embodiment of the present invention are shown in Tables 1 and 2.

Radii r of curvature of the respective surfaces, surface-to-surface distances d, and glass materials are shown in Tables 1 and 2 in an order from the first plane P1 as an object plane corresponding to the pattern formation surface of the reticle R to the second plane P2 as an image plane corresponding to the surface of the wafer W. In Table 1, the sign of the radius r of curvature of each surface is positive when a convex surface faces the reticle R side in an optical path between the reticle R and the first concave mirror $M_1$, and positive when the convex surface faces the beam splitter BS side in an optical path between the beam splitter BS and the wafer W. The sign of the surface-to-surface distance d is negative in an optical path from the first concave mirror $M_1$ to the second concave mirror $M_2$ and positive in the remaining optical paths.

In Tables 1 and 2, NA represents the numerical aperture on the wafer W side (image-side numerical aperture); d0, the distance from the reticle R (object side) to a lens surface (first lens surface) of the first lens group $G_1$ which is closest to the reticle R side (object side); and WD, the distance (working distance) from a lens surface of the third lens group $G_3$ which is closest to the wafer W side (image side) to the wafer W (image plane). Note that $CaF_2$ and $SiO_2$ respectively represent fluorite and silica glass as glass materials in Tables 1 to 3. The refractive indices of silica glass and fluorite at the fundamental wavelength (ArF excimer laser wavelength: $\lambda=193.4$ nm) are as follows:

Silica glass ($SiO_2$): 1.56019

Fluorite ($CaF_2$): 1.50138

TABLE 1

First Embodiment
NA = 0.6
d0 = 60.0
WD = 15.0

| | r | d | Glass Material | |
|---|---|---|---|---|
| 1 | 1765.846 | 15.000 | $SiO_2$ | |
| 2 | 429.527 | 82.904 | | |
| 3 | 309.537 | 15.000 | $CaF_2$ | |
| 4 | 414.652 | 15.039 | | |
| 5 | 355.354 | 28.821 | $SiO_2$ | |
| 6 | -520.129 | 170.056 | | |
| 7 | -168.619 | 40.000 | $SiO_2$ | |
| 8 | 486.493 | 1.870 | | |
| 9 | 403.866 | 40.000 | $SiO_2$ | |
| 10 | -245.333 | 38.615 | | |
| 11 | -1045.010 | 40.000 | $CaF_2$ | |
| 12 | 1488.009 | 55.962 | | |
| 13 | 0.000 | 180.000 | $SiO_2$ | |
| 14 | 0.000 | 0.500 | | |
| 15 | 5153.516 | 28.663 | $SiO_2$ | |
| 16 | -260.576 | 5.039 | | |
| 17 | -211.818 | 15.000 | $SiO_2$ | |
| 18 | -1215.520 | 0.500 | | |
| 19 | -1602.900 | -0.500 | | First concave mirror ($M_1$) |
| 20 | -1215.520 | -15.000 | $SiO_2$ | |
| 21 | -211.818 | -5.039 | | |
| 22 | -260.576 | -28.663 | $SiO_2$ | |
| 23 | 5153.516 | -0.500 | | |
| 24 | 0.000 | -90.000 | $SiO_2$ | |
| 25 | 0.000 | -90.000 | $SiO_2$ | Direction change surface |
| 26 | 0.000 | -15.000 | | |
| 27 | 529.666 | 10.000 | | Second concave mirror ($M_2$) |
| 28 | 0.000 | 5.000 | | |
| 29 | 0.000 | 180.000 | $SiO_2$ | |
| 30 | 0.000 | 0.500 | | |
| 31 | 230.748 | 13.000 | $SiO_2$ | |
| 32 | 415.105 | 0.500 | | |
| 33 | 360.974 | 15.000 | $SiO_2$ | |
| 34 | 2299.904 | 0.500 | | |
| 35 | 93.549 | 23.295 | $CaF_2$ | |
| 36 | -448.138 | 0.730 | | |
| 37 | -400.000 | 15.000 | $SiO_2$ | |

TABLE 1-continued

First Embodiment
NA = 0.6
d0 = 60.0
WD = 15.0

| | r | d | Glass Material |
|---|---|---|---|
| 38 | 69.414 | 2.161 | |
| 39 | 87.125 | 29.040 | $SiO_2$ |
| 40 | -479.684 | (WD) | |

TABLE 2

Second Embodiment
NA = 0.6
d0 = 80.0
WD = 15.0

| | r | d | Glass Material | |
|---|---|---|---|---|
| 1 | -343.746 | 15.000 | $SiO_2$ | |
| 2 | -427.376 | 12.445 | | |
| 3 | 1017.870 | 15.000 | $SiO_2$ | |
| 4 | 209.735 | 0.500 | | |
| 5 | 202.511 | 33.841 | $CaF_2$ | |
| 6 | -326.284 | 166.780 | | |
| 7 | -278.600 | 27.443 | $SiO_2$ | |
| 8 | -155.378 | 2.168 | | |
| 9 | -145.441 | 15.000 | $CaF_2$ | |
| 10 | 568.866 | 6.250 | | |
| 11 | 311.600 | 35.869 | $SiO_2$ | |
| 12 | -318.520 | 43.410 | | |
| 13 | -425.237 | 15.000 | $SiO_2$ | |
| 14 | 2671.570 | 92.394 | | |
| 15 | 0.000 | 180.000 | $SiO_2$ | |
| 16 | 0.000 | 0.500 | | |
| 17 | -20404.400 | 40.000 | $SiO_2$ | |
| 18 | -244.455 | 4.625 | | |
| 19 | -204.486 | 15.000 | $SiO_2$ | |
| 20 | -909.873 | 0.500 | | |
| 21 | -1745.080 | -0.500 | | First concave mirror ($M_1$) |
| 22 | -909.873 | -15.000 | $SiO_2$ | |
| 23 | -204.486 | -4.625 | | |
| 24 | -244.455 | -40.000 | $SiO_2$ | |
| 25 | -20404.400 | -0.500 | | |
| 26 | 0.000 | -90.000 | $SiO_2$ | |
| 27 | 0.000 | -90.000 | $SiO_2$ | Direction change surface |
| 28 | 0.000 | -15.000 | | |
| 29 | 498.384 | 10.000 | | Second concave mirror ($M_2$) |
| 30 | 0.000 | 5.000 | | |
| 31 | 0.000 | 180.000 | $SiO_2$ | |
| 32 | 0.000 | 0.500 | | |
| 33 | 283.103 | 21.790 | $SiO_2$ | |
| 34 | 7096.110 | 0.500 | | |
| 35 | 95.193 | 24.049 | $CaF_2$ | |
| 36 | -315.041 | 0.500 | | |
| 37 | -300.000 | 20.654 | $SiO_2$ | |
| 38 | 69.687 | 1.481 | | |
| 39 | 82.867 | 23.439 | $SiO_2$ | |
| 40 | -544.926 | (WD) | | |

The condition correspondence values of the embodiments are shown in Table 3.

TABLE 3

| | First Embodiment | Second Embodiment |
|---|---|---|
| (1) $1/\beta M1$ | 0.132 | 0.192 |
| (2) $\beta M2$ | 0 | -0.0263 |

TABLE 3-continued

|  | First Embodiment | Second Embodiment |
|---|---|---|
| (3) 1/β1 | 0.0498 | 0.609 |
| (4) β2 | −0.0124 | −0.0152 |

Figure 7A:
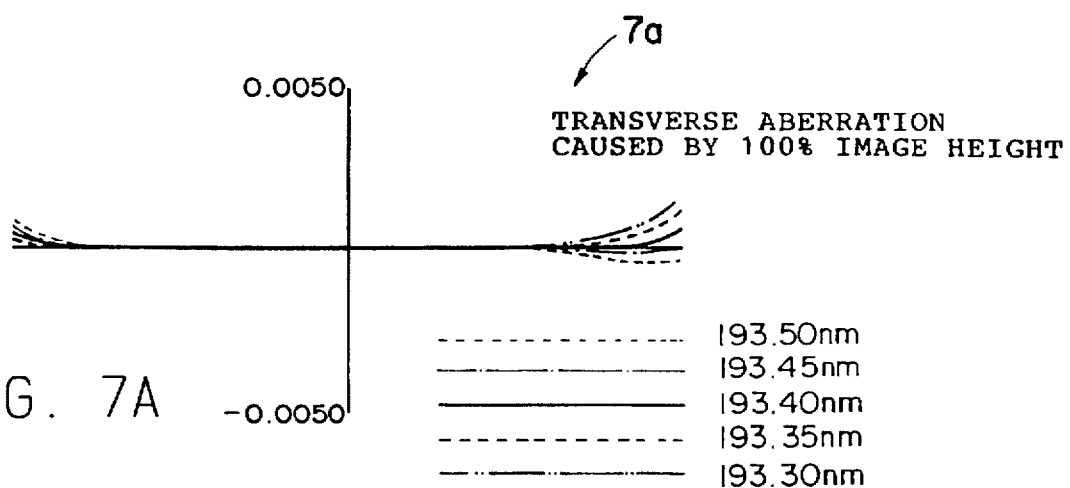
FIGS. 7A to 7C are graphs showing transverse aberrations of the first embodiment shown in FIG. 5, in which a transverse aberration 7a in the upper portion is caused by a 100% image height, a transverse aberration 7b in the middle portion is caused by a 50% image height, and a transverse aberration 7c in the lower portion is caused by a 0% image height.
Figure 7B:
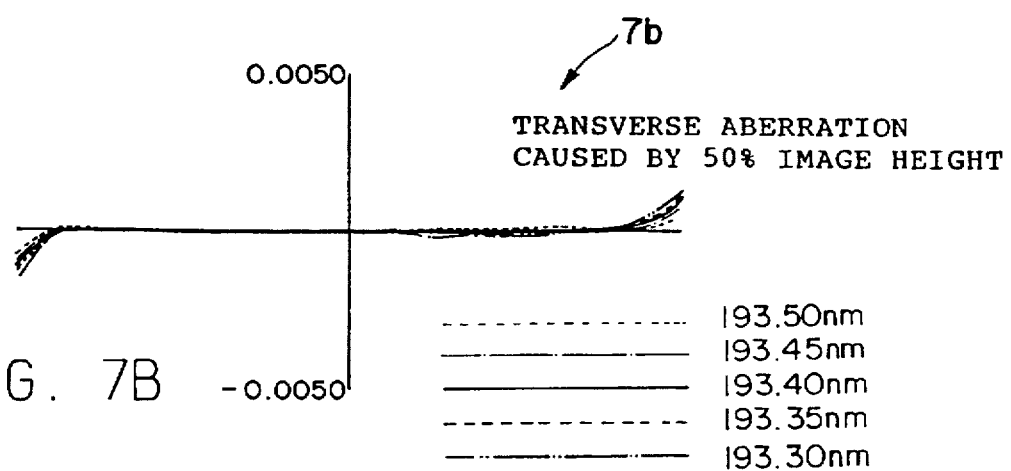
Figure 7C:
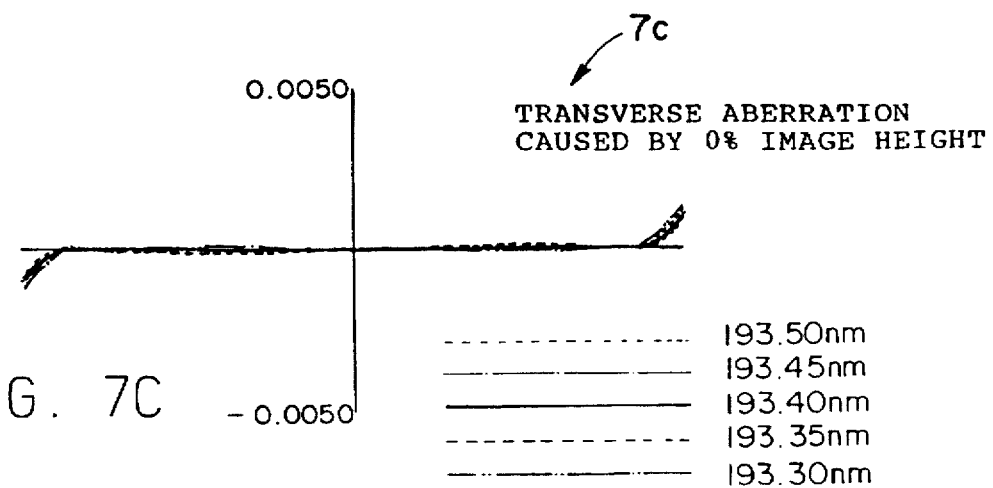
Figure 8A:
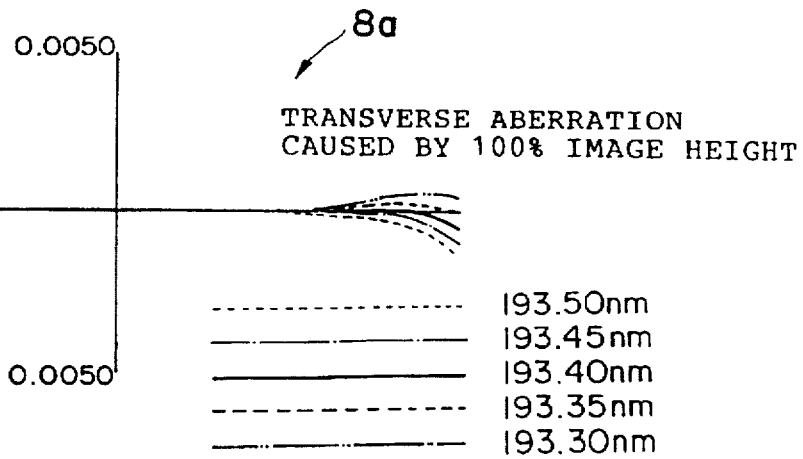
FIGS. 8A to 8C are graphs showing transverse aberrations of the second embodiment shown in FIG. 6, in which a transverse aberration 8a in the upper portion is caused by a 100% image height, a transverse aberration 8b in the middle portion is caused by a 50% image height, and a transverse aberration 8c in the lower portion is caused by a 0% image height.
Figure 8B:
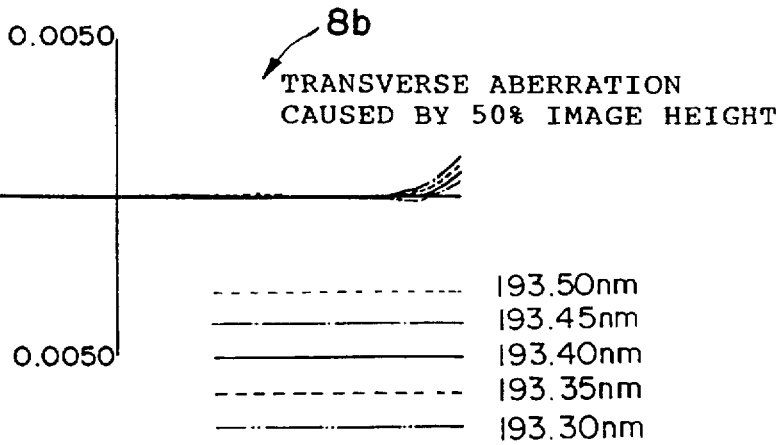
Figure 8C:
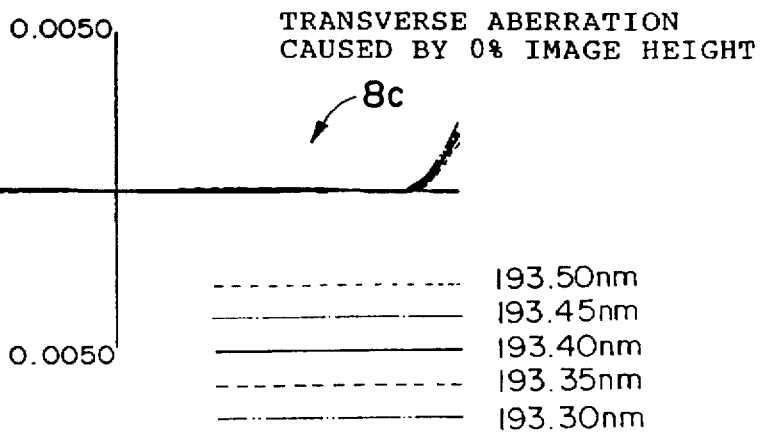

FIGS. 7A to 8C are graphs showing transverse aberrations of the first and second embodiments of the present invention. In this case, 7a in FIG. 7A and 8a in FIG. 8A show transverse aberrations at a 100% image height (image height: 15.3 mm); 7b in FIG. 7B and 8b in FIG. 8B show transverse aberrations at a 50% image height (image height: 7.65 mm); and 7c in FIG. 7C and 8c in FIG. 8C show transverse aberrations at a 0% image height (on the optical axis, i.e., image height: 0.0 mm). In each graph, a solid line indicates an aberration curve at a fundamental wavelength ($\lambda=193.40$ nm); a dotted line, an aberration curve at a wavelength $\lambda=193.50$ nm; a chain line, an aberration curve at a wavelength $\lambda=193.45$ nm, a dashed line, an aberration curve at a wavelength $\lambda=193.35$ nm, and a chain double-dashed line, an aberration curve at a wavelength $\lambda=193.30$ nm. As is apparent from FIGS. 7 and 8 showing the transverse aberrations, the catadioptric optical system according to each embodiment achieves a very large numerical aperture NA=0.6, though the aberrations are satisfactorily corrected. In particular, a chromatic aberration at a wavelength of 193.4 nm±0.1 nm is corrected to realize an excellent imaging performance.

In the above first and second embodiments, a plane mirror for deflecting the optical path may be arranged on the optical path. As shown in FIG. 9, when a plane mirror 14 for deflecting the optical path is arranged in the first lens group, the reticle R (object) and the wafer W (image plane) can be arranged in parallel. Note that this arrangement is disclosed in detail in U.S. Pat. No. 5,402,267.

As described above, according to the catadioptric optical system of the present invention, excellent imaging performance can be achieved to realize a resolution of quartermicron order in the ultraviolet wavelength region.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 324433/1994 (6-324433) filed on Dec. 27, 1994 is hereby incorporated by reference.

What is claimed is:

1. A catadioptric optical system for projecting a reduced image of a pattern on a first plane onto a second plane, comprising:

a beam splitter;

an input lens group arranged in an optical path between the first plane and said beam splitter, said input lens group guiding a light beam from said first plane to said beam splitter;

a first concave mirror having an enlargement imaging magnification, said first concave mirror causing the light beam incident from said input lens groups on said beam splitter and passing through said beam splitter to be incident on said beam splitter again;

a second concave mirror having a reduction imaging magnification, said second concave mirror causing the light beam incident from said first concave mirror on said beam splitter and passing through said beam splitter to be incident on said beam splitter again; and an output lens group arranged in an optical path between said beam splitter and the second plane, said output lens group guiding the light beam incident from said second concave mirror on said beam splitter and passing through said beam splitter to said second plane, wherein said catadioptric optical system satisfies the following conditions:

$$-0.9 < 1/\beta_{M1} < 0.8$$

$$-0.07 < \beta_{M2} < 0.06$$

where $\beta_{M1}$: the imaging magnification of said first concave mirror;

$\beta_{M2}$: the imaging magnification of said second concave mirror.

2. A system according to claim 1, wherein
said first concave mirror is arranged in an optical path of the light beam incident from said input lens group on said beam splitter and passing through said beam splitter, and said second concave mirror is arranged on an optical path of the light beam incident from said first concave mirror on said beam splitter and reflected by a beam splitter surface in said beam splitter.

3. A system according to claim 2, wherein
said first concave mirror is arranged on an opposite side of said input lens group with respect to said beam splitter, and said second concave mirror is arranged on an opposite side of said output lens group with respect to said beam splitter.

4. A system according to claim 1, further comprising an additional lens group arranged in an optical path between said beam splitter and said first concave mirror.

5. A system according to claim 4, wherein said catadioptric optical system satisfies the following condition:

$$-0.27 < 1/\beta_1 < 0.25$$

where $\beta_1$: a composite imaging magnification of said input lens group, said additional lens group, and said first concave mirror.

6. A system according to claim 4, wherein said catadioptric optical system satisfies the following condition:

$$-0.05 < 1/\beta_2 < 0.07$$

where $\beta_2$: a composite imaging magnification of said second concave mirror and said output lens group.

7. A system according to claim 1, wherein each of said input lens group and said output lens group includes a refraction element essentially consisting of one of at least two different materials.

8. A system according to claim 7, wherein
said input lens group includes at least one lens component essentially consisting of fluorite, and said output lens group includes at least one lens component essentially consisting of fluorite.

9. A system according to claim 1, wherein
said beam splitter is a polarization beam splitter, and
said catadioptric optical system has $\lambda/4$ plates in an optical path between said beam splitter and said first concave mirror and in an optical path between said beam splitter and said second concave mirror, respectively.

10. An exposure apparatus comprising:

a first stage allowing a photosensitive substrate to be held on a main surface thereof;

a second stage for holding a mask having a predetermined pattern;

an illumination optical system for emitting an exposure light having a predetermined wavelength onto said mask and transferring the pattern on said mask onto said substrate; and a catadioptric optical system, arranged between said first stage and said second stage, for projecting a reduced image of the pattern on said mask onto said substrate, said catadioptric optical system comprising a beam splitter, an input lens group arranged in an optical path between said mask and said beam splitter, said input lens group guiding the exposure light passing through said mask to said beam splitter, a first concave mirror having an enlargement imaging magnification, said first concave mirror causing the light beam incident from said input lens group on said beam splitter and passing through said beam splitter to be incident on said beam splitter again;

a second concave mirror having a reduction imaging magnification, said second concave mirror causing the light beam incident from said first concave mirror onto said beam splitter and passing through said beam splitter to be incident on said beam splitter again; and an output lens group arranged in an optical path between said beam splitter and said substrate, said output lens group guiding the light beam incident from said second concave mirror on said beam splitter and passing through said beam splitter to said substrate, wherein said catadioptric optical system satisfies the following conditions:

$$-0.9<1/\beta_{M1}<0.8$$

$$-0.07<\beta_{M2}<0.06$$

where $\beta_{M1}$: the imaging magnification of said first concave mirror;

$\beta_{M2}$: the imaging magnification of said second concave mirror.

11. An apparatus according to claim 10, wherein said catadioptric optical system further comprises an additional lens group arranged in an optical path between said beam splitter and said first concave mirror.

12. An apparatus according to claim 11, wherein said catadioptric optical system satisfies the following condition:

$$-0.27<1/\beta_1<0.25$$

where $\beta_1$: a composite imaging magnification of said input lens group, said additional lens group, and said first concave mirror.

13. An apparatus according to claim 11, wherein said catadioptric optical system satisfies the following condition:

$$-0.05<1/\beta_2<0.07$$

where $\beta_2$: a composite imaging magnification of said second concave mirror and said output lens group.

14. A catadioptric optical system for projecting an image of a pattern on a first plane onto a second plane, said catadioptric optical system comprising:

a beam splitter disposed in an optical path between said first plane and said second plane;

a first concave mirror causing the light beam incident on said beam splitter and passing through said beam splitter to be incident on said beam splitter again; and a second concave mirror causing the light beam incident from said first concave mirror on said beam splitter and passing through said beam splitter to be incident on said beam splitter again, wherein the light from said first plane, in the following order, passes through said beam splitter, is reflected by said first concave mirror, is incident on said beam splitter again, is reflected by a beam splitter surface of said beam splitter, is incident on said second concave mirror, is reflected by said second concave mirror, passes through said beam splitter again, and reaches said second surface.

15. A system according to claim 14, wherein said first concave mirror has an enlargement imaging magnification, and said second concave mirror has a reduction imaging magnification.

* * * * *